(12) United States Patent
Schwarz et al.

(10) Patent No.: US 12,075,561 B2
(45) Date of Patent: Aug. 27, 2024

(54) EMBEDDING COMPONENT IN COMPONENT CARRIER BY COMPONENT FIXATION STRUCTURE

(71) Applicant: AT&S Austria Technologie & Systemtechnik Aktiengesellschaft, Leoben (AT)

(72) Inventors: Timo Schwarz, St. Michael i.O. (AT); Andreas Zluc, Leoben (AT); Mario Schober, Trofaiach (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/453,029

(22) Filed: Nov. 1, 2021

(65) Prior Publication Data

US 2022/0053633 A1 Feb. 17, 2022

Related U.S. Application Data

(63) Continuation of application No. 15/387,372, filed on Dec. 21, 2016, now abandoned.

(51) Int. Cl.
*H05K 3/30* (2006.01)
*H01L 23/538* (2006.01)
(Continued)

(52) U.S. Cl.
CPC ....... *H05K 1/0271* (2013.01); *H01L 23/5389* (2013.01); *H05K 1/0203* (2013.01);
(Continued)

(58) Field of Classification Search
CPC ........ H05K 1/0271; H05K 3/007; H05K 3/30; H05K 3/301; H05K 2203/1469; H01L 23/5389
See application file for complete search history.

(56) References Cited

U.S. PATENT DOCUMENTS 9,059,106 B2 * 6/2015 Daubenspeck ......... H01L 24/06
9,661,762 B2 * 5/2017 Katsuda ............... H05K 3/4688
(Continued)

FOREIGN PATENT DOCUMENTS

CN 1893776 A 1/2007
CN 101160024 A 4/2008
(Continued)

OTHER PUBLICATIONS

Batev, P.; Extended European Search Report in Application No. 17209135.7, pp. 1-8; May 23, 2018, European Patent Office; 80298, Munich, Germany.
(Continued)

*Primary Examiner* — Jeffrey T Carley
(74) *Attorney, Agent, or Firm* — Robert A. Blaha; Smith Tempel Blaha LLC

(57) ABSTRACT

A method of manufacturing a component carrier includes providing a base structure having a main surface that is at least partially covered by a component fixation structure; providing a component, the component intrinsically comprising warpage; mounting the component on a surface provided on a plate structure and/or on the base structure to remove the warpage of the component at least partially; and fixating the component to the component carrier through the component fixation structure.

20 Claims, 10 Drawing Sheets

(51) Int. Cl.
*H05K 1/02* (2006.01)
*H05K 1/18* (2006.01)
*H05K 3/00* (2006.01)
*H05K 3/46* (2006.01)

(52) U.S. Cl.
CPC ........... *H05K 1/0216* (2013.01); *H05K 1/028* (2013.01); *H05K 1/185* (2013.01); *H05K 3/007* (2013.01); *H05K 3/30* (2013.01); *H05K 3/301* (2013.01); *H05K 3/4611* (2013.01); *H05K 3/4652* (2013.01); *H05K 2201/068* (2013.01); *H05K 2203/1469* (2013.01)

(56) References Cited

U.S. PATENT DOCUMENTS

| | | | |
|---|---|---|---|
| 11,228,125 B1* | 1/2022 | Su | H01R 43/00 |
| 2004/0082100 A1 | 4/2004 | Tsukahara et al. | |
| 2006/0065905 A1* | 3/2006 | Eisert | H01L 24/95 |
| | | | 257/95 |
| 2007/0006456 A1 | 1/2007 | Kim et al. | |
| 2007/0020908 A1 | 1/2007 | Honer et al. | |
| 2007/0169342 A1* | 7/2007 | Lassar | H05K 1/111 |
| | | | 29/842 |
| 2007/0210427 A1* | 9/2007 | Lytle | H01L 23/5389 |
| | | | 257/E23.179 |
| 2007/0290366 A1 | 12/2007 | Cheng | |
| 2008/0052906 A1 | 3/2008 | Lee et al. | |
| 2010/0123239 A1 | 5/2010 | Kunimoto | |
| 2010/0155124 A1* | 6/2010 | Kawamura | H05K 1/185 |
| | | | 29/832 |
| 2011/0163457 A1 | 7/2011 | Mohan et al. | |
| 2011/0227214 A1* | 9/2011 | Tateiwa | H01L 24/81 |
| | | | 438/126 |
| 2012/0048605 A1* | 3/2012 | Chung | H01L 23/5389 |
| | | | 29/846 |
| 2012/0085572 A1* | 4/2012 | Sakai | H01L 23/5389 |
| | | | 29/829 |
| 2013/0095608 A1* | 4/2013 | Chen | B23Q 3/18 |
| | | | 29/25.01 |
| 2013/0284506 A1 | 10/2013 | Zanma et al. | |
| 2014/0242729 A1* | 8/2014 | Mannen | H01L 21/68735 |
| | | | 425/11 |
| 2014/0311774 A1* | 10/2014 | Yugami | H05K 1/0271 |
| | | | 174/254 |
| 2014/0360760 A1 | 12/2014 | Kiwanami et al. | |
| 2015/0223341 A1 | 8/2015 | Kim et al. | |
| 2015/0296625 A1 | 10/2015 | Jung et al. | |
| 2016/0250830 A1 | 9/2016 | Kiya et al. | |
| 2016/0381792 A1 | 12/2016 | Mok et al. | |
| 2017/0047294 A1* | 2/2017 | Chang | H01L 21/486 |
| 2017/0280595 A1 | 9/2017 | Mori et al. | |

FOREIGN PATENT DOCUMENTS

| | | |
|---|---|---|
| JP | 2007134356 A | 5/2007 |
| KR | 20030017677 A | 3/2003 |

OTHER PUBLICATIONS

Wu, M.; Search Report, Electrical Invention Examination Dept. Hubei Center of the CNIPA, Jul. 21, 2020, pp. 1-2.

First Office Action in Application No. 2017113976345; pp. 1-9; Jul. 28, 2020; The China National Intellectual Property Administration; No. 6, Xitucheng Lu, Jimenqiao Haidian District, Beijing City, China 100088.

English Translation of the First Office Action in Application No. 2017113976345; pp. 1-4; Jul. 28, 2020; The China National Intellectual Property Administration; No. 6, Xitucheng Lu, Jimenqiao Haidian District, Beijing City, China 100088.

English Translation of the cover page of the First Office Action in Application No. 2017113976345; pp. 1-3; Jul. 28, 2020; The China National Intellectual Property Administration; No. 6, Xitucheng Lu, Jimenqiao Haidian District, Beijing City, China 100088.

* cited by examiner

EMBEDDING COMPONENT IN COMPONENT CARRIER BY COMPONENT FIXATION STRUCTURE

CROSS-REFERENCE TO RELATED APPLICATION

This application is a continuation of U.S. patent application Ser. No. 15/387,372, entitled "Embedding Component in Component Carrier by Component Fixation Structure, filed on Dec. 21, 2016, which is incorporated herein by reference in its entirety.

TECHNICAL FIELD

The invention relates to a method of manufacturing a component carrier, to a semifinished product and to a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, efficiently embedding a component in a component carrier is an issue. This is in particular difficult when components are embedded which have warpage.

SUMMARY

There is a need to efficiently embed a component, even when having warpage, in a component carrier.

This need may be satisfied by a method of manufacturing a component carrier, a semifinished product and a component carrier according to the independent claims as provided.

According to an exemplary embodiment of the invention, a method of manufacturing a component carrier is provided, wherein the method comprises covering a main surface of a base structure at least partially by a component fixation structure (in particular for obtaining a first preform body), mounting a component on a carrier (in particular for obtaining a second preform body being separate from the first preform body), and interconnecting the base structure with the carrier (in particular by interconnecting the first preform body with the second preform body to obtain an integral body) so that the component extends (in particular only) partially into the component fixation structure.

According to another exemplary embodiment of the invention, a semifinished product for manufacturing a component carrier is provided, wherein the semifinished product comprises a base structure at least partially covered by a component fixation structure (in particular for obtaining a first preform body), and a carrier with a component mounted thereon (in particular for obtaining a second preform body being separate from the first preform body), wherein the base structure is interconnected (i.e. in a state in which the first preform body and the second preform body are already interconnected to already form an integral body) or is to be interconnected (i.e. in a state in which the first preform body and the second preform body are not yet interconnected) with the carrier so that the component extends partially into the component fixation structure.

According to still another exemplary embodiment of the invention, a component carrier is provided, wherein the component carrier comprises an interconnected stack comprising at least one electrically insulating layer structure and/or at least one electrically conductive layer structure, a component fixation structure in the stack, and a component embedded in the stack and extending at least partially into the component fixation structure so that a thickness of the component fixation structure under the component is smaller than a thickness of the component fixation structure laterally to the component.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "semifinished product" may particularly denote a structure which is not yet a readily finished component carrier, but in contrast to this is a pre-form thereof obtained during manufacture of a component carrier. In particular, such a semifinished product may still comprise a temporary carrier which is to be removed from the rest of the component carrier or a pre-form thereof later during the manufacturing process. However, such a temporary carrier provides temporarily mechanical support as long as the pre-form of the component carrier is not yet in a configuration in which it can support itself without its various elements being prone to changing their relative positions to one another before mutual fixation or interconnection. It is also possible that a semifinished product still lacks other features of a readily manufactured component carrier, such as one or more layer structures to be attached thereto and/or vertical interconnects for electrically and/or thermally connecting an embedded component to an environment.

According to an exemplary embodiment of the invention, a manufacturing architecture for manufacturing component carriers such as printed circuit boards (PCBs) is provided which also allows embedding components showing warpage (such as bending). Conventionally, embedding a component showing warpage into a component carrier also resulted in the risk of obtaining a component carrier showing warpage as well. This is however undesired in terms of reliability, proper connection with other electronic members, and a tendency of delamination of a component carrier with warpage. In contrast to such a conventional approach, an exemplary embodiment of the invention removes potential warpage of a component by mounting the component on a (for instance temporary) carrier. When adhering the component on the carrier to form a preform body, the component is connected to the carrier without remaining warpage. Another preform body which may be implemented during such a manufacturing process is a component fixation structure on a supporting base structure. The component fixation structure may be configured (in particular in terms of material selection) so that upon connecting the both mentioned preform bodies to one another, the (in particular now warpage-free) component protrudes partially into the component fixation structure and can be fixed (in particular by curing the component fixation structure) there while maintaining a small distance with regard to the base structure. For instance, the component may be fused into the component fixation structure to form a permanently integral structure. Thereby, the component may be interconnected within a stack of component carrier material in a warpage-free manner, even if the component itself showed warpage prior to its mounting on the carrier. A remaining small distance between the component press-fitted in the component fixation structure on the one hand and the base structure on the other hand ensures that the formation of contacts for later electrically and/or thermally contacting the embedded component is rendered very simple, since contact holes need to be formed only through a small thickness. While the mentioned advantages are particularly pronounced when embedding components with warpage in component carrier material in a way that the entire component does not show warpage or only shows a significantly reduced warpage, it should also be said that other exemplary embodiments of the invention may also be used for embedding components being free of warpage in component carrier material in a simple manufacturing process so that a reliable component carrier can be obtained. In particular, no extra effort is needed for ensuring that components to be embedded are free of warpage, since both components with and without warpage can be embedded with the described manufacturing architecture.

Exemplary Embodiments

In the following, further exemplary embodiments of the method, the semifinished product and the component carrier will be explained.

In an embodiment, the carrier is a temporary carrier which is removed before completing manufacture of the component carrier. In the context of the present application, the term "temporary carrier" may particularly denote a body connected to a component only during manufacturing the component carrier, wherein this body is removed from the manufactured component carrier or a preform thereof prior to the first use of the component carrier. Thus, the temporary carrier does not form part of the readily manufactured component carrier during its actual use or operation. Such a concept allows to design the temporary carrier specifically in accordance with its desired temporary carrying function without any constraints concerning its compatibility with remaining component carrier material, for instance in terms of Young modulus, coefficient of thermal expansion, etc. When embodied as a temporary carrier, the carrier may be, in one embodiment, a sticky tape showing flexibility and capability of adhering the component temporarily. It is however also possible that the temporary carrier is then formed with a rigid carrier plate having an adhesive surface. Both embodiments allow to temporarily carry the component in a way that any potential warpage of the component is suppressed or even eliminated.

However, in other exemplary embodiments, the carrier may be a permanent carrier forming part of the readily manufactured component carrier. In such an embodiment, it is advantageous when the material of the carrier is similar to component carrier material, in particular shows thermal expansion coefficients and/or values of the Young modulus being similar or identical to that of the remaining component carrier material or part thereof. In such an embodiment, the temporary carrier may for instance be made of FR4 material and/or copper material.

In an embodiment, the main surface of the base structure is covered at least partly with an at least partially uncured material as the component fixation structure. In the context of the present application, the term "at least partially uncured material" may particularly denote material which becomes re-flowable during a lamination procedure, i.e., by the application of temperature and/or pressure. For example, such a material may be a resin which is still non-cross-linked. When the component fixation structure is made of an at least partially uncured material, pressing the component into the component fixation structure may be accomplished in the framework of a lamination procedure in which the material of the component fixation structure temporarily re-melts or becomes flowable, wherein subsequent re-solidification of the material of the component fixation structure then results in a fixed embedding of the component without warpage. In other words, fixation of the component by pressing it into the component fixation structure may be carried out in the same process and thus simultaneously with the curing of the previously at least partially uncured material of the component fixation structure. It is also possible that the component fixation structure is made of an adhesive material, for instance a liquid adhesive such as an epoxy-based adhesive.

In an embodiment, the component fixation structure comprises at least one of the group consisting of resin, in particular epoxy resin or Bismaleimide-Triazine resin, prepreg, cyanate ester, polyimide, acrylate, and prepreg. Those materials have the advantage of being available in an at least partially uncured state (also denoted as B stage, for instance) and can therefore be cured for fixing the component therein. At the same time, these materials are properly compatible with other component carrier material in their neighbourhood within the component carrier under manufacture, so that no issues occur with thermal mismatch or the like. Thereby, a reliable component carrier may be obtained.

In an embodiment, the component fixation structure has a thickness in a range between 2 µm and 50 µm, in particular in a range between 5 µm and 20 µm (larger thicknesses are however possible, in particular when relatively thick components shall be embedded). The component fixation structure may therefore be provided as a layer with a homogeneous thickness. Upon immersing or pressing the component into the component fixation structure, the thickness may be locally reduced at a position of the component, whereas a thickness of the component fixation structure (here embodied as layer of homogeneous material) may be larger. With the mentioned small thicknesses, it has turned out possible to properly fix components with previously only provisionally reduced or eliminated warpage due to their mounting on a sticky carrier. The consequently remaining only very small thickness of the component fixation structure beneath the pressed-in component has significant advantages in terms of the then very simple formation of contacts for contacting the embedded component.

In an embodiment, the base structure is made of a fully cured material. In this context, the term "fully cured" may particularly denote a material property according to which the corresponding material (such as resin) is not capable any more of being re-melted to become flowable and of being subsequently re-solidified. Such resin material may be already cross-linked. Thus, the fully cured material may be C-stage material rather than A-stage or B-stage material. By taking this measure it can be ensured that the base structure itself does not lose its supporting function or change it position during the interconnection procedure (in particular a lamination procedure which may involve increased pressure and/or increased temperature), so that high positional accuracy may be ensured.

In an embodiment, the base structure comprises at least one of the group consisting of a core, a stack comprising at least one electrically insulating layer structure and/or at least one electrically conductive layer structure, and a metal foil. A core may be a base structure made of fully cured material such as FR4 (i.e., resin including reinforcing particles such as glass fibres). When embodying the base structure as a multi-layer stack, it is possible to already prepare a later used electronic function of the multi-layer structure apart from its supporting function as base structure. When embodied as a metal foil, the base structure may for instance be a copper foil.

In an embodiment, the method comprises at least partially removing warpage of the component by mounting, in particular adhering, the component on the carrier. Therefore, the provisional removal of warpage of the component may be accomplished due to its mounting on an adhesive surface of the carrier. For instance, an electronic chip such as a semiconductor chip with a very small thickness of for example less than 40 μm and having the intrinsic tendency of showing warpage may be provisionally fixed on the carrier by adhering so that the planarity of the mounting surface of the carrier translates into a removal of a warpage of the component. A permanent removal of the warpage of the component may then be accomplished by pressing the so prepared component on the carrier partially into the component fixation structure, thereby forming an integral interconnection with the latter. Therefore, the combination of the mounting of the component on the carrier for provisionally removing or reducing warpage and the permanent removal or suppression of the warpage by pressing the component into the component fixation structure is of particular advantage.

In an embodiment, the interconnecting is carried out by laminating. The term "lamination" may particularly denote the application of mechanical pressure, if desired in combination with heat. However, other interconnection techniques are possible as well, for instance adhering or gluing.

In an embodiment, the method comprises covering an opposing another main surface of the base structure at least partially by a further component fixation structure, mounting a further component on a further carrier, and interconnecting the base structure with the further carrier so that the further component extends partially into the further component fixation structure. In such an embodiment (compare for instance FIG. 8 to FIG. 13), both opposing main surfaces of the base structure may be used for attaching one or more respective components thereon in a warpage-free way so that a component carrier with a high electrical performance can be obtained. Such a concept also allows for a highly efficient batch processing of multiple component carriers at the same time, when the obtained structure is later separated into different component carriers.

In an embodiment, the method comprises forming at least one contact hole in the base structure before the covering with the component fixation structure, and filling the at least one contact hole at least partially with electrically conductive material after the interconnecting. Formation of one or more contact hole in the (in particular core type) base structure already before the interconnection (in particular lamination) has the advantage that it can then become dispensable to later drill such contact holes (for instance by laser processing) through the relatively thick base structure which may harm the then very closely positioned component (for instance made of semiconductor material). Formation of the one or more contact holes at an early stage thereby prevents deterioration or even damage of the component. Filling the contact holes with electrically conductive and/or thermally conductive material may be carried out at the end of the manufacturing procedure, for instance by plating (for example in an electroless manner or galvanically). The one or more access holes may hence be filled for example with copper material.

In an embodiment, the method comprises forming the component fixation structure selectively only on a portion of the main surface of the base structure. This can be accomplished for example by transferring material of the component fixation structure on the main surface of the base structure from an auxiliary body by a transfer body having at least one elevated or protruding section corresponding to the said portion. When applying the material of the component fixation structure selectively only on one or more specific portions of the main surface of the base structure, the remaining surface portions may be efficiently used for other purposes, for instance for the formation of conductor traces of the component carrier. Furthermore, the required material of the component fixation structure may then be kept very small. Highly advantageously, such a transfer of material of the component fixation structure may be accomplished by a stamp or punch architecture in which an auxiliary body with protruding sections presses material of the component fixation structure selectively only on one or more desired sub-sections of the base structure. This is a highly efficient procedure of applying the material of the component fixation structure with high positional accuracy.

In an embodiment, the method comprises mounting the component on a flat carrier (such as a plate), in particular on a cavity-free carrier. Mounting the component on a flat or planar carrier, which does not show a pronounced surface profile such as one or more cavities in or around a mounting region of the component allows to prevent the cumbersome process of mounting a component in a cavity.

In an embodiment, the method comprises re-melting and subsequently re-solidifying material of the component fixation structure during the interconnecting so that the component is integrally fixed onto the component fixation structure. The concept of re-melting and re-solidification (in particular in terms of curing material of the component fixation structure) has turned out as a simple and efficient mechanism of fixing the component within the component fixation structure in a warpage-free way.

In an embodiment, the method comprises pressing (in particular by laminating) the component partially into the component fixation structure and simultaneously and/or subsequently curing (in particular as well by laminating) the component fixation structure so that the component is permanently immobilized (in particular in a warpage-free way, even if the component taken alone shows warpage) within the cured component fixation structure. For instance, a component showing intrinsic warpage may be provisionally rendered warpage-free by mounting it on the carrier, and can then be rendered permanently warpage-free by being pressed into and permanently interconnected with the component fixation structure which is thereby permanently hardened. Thus, the described two-stage procedure of treating the component (i.e. mounting on carrier, and pressing in component fixation structure upon curing the latter) prevents any intrinsic warpage of the component from translating into substantial warpage of the component carrier.

In an embodiment, the method comprises flipping (or turning around, in particular by 180°) the carrier with the component (in particular a plurality of components) mounted thereon before the interconnecting with the base structure covered with the component fixation structure. According to such an embodiment, one or preferably multiple (for instance more than 100) components may be mounted on the carrier (in particular by adhesion). Thereafter, the carrier with the component(s) assembled thereon, i.e., the second preform body, may be flipped or turned around before interconnection with the first preform body. Thus, it is possible to form the semifinished product efficiently by a batch procedure. It is thus dispensable to connect each individual component by a pick and place procedure on the component fixation structure.

In an embodiment, the component is at least partially arranged in a cavity of the carrier, in particular in a blind hole type cavity, of the base structure. Embedding the component in a cavity allows to surround the component with a material of desired properties, for instance shielding electromagnetic radiation, removing thermal energy during operation of the component carrier, etc. Formation of a cavity, if desired, may be accomplished by forming a corresponding surface profile of the base structure. Permanent attachment of the component in the cavity may then be accomplished by the component fixation structure.

In an embodiment, the component fixation structure comprises or consists of the same material, in particular the same resin, as at least one of the base structure and the at least one electrically insulating layer structure of the semifinished product or the component carrier. When adapting the material of the component fixation structure and the remaining component carrier material in the described way, problems resulting from different values of the coefficient of thermal expansion and/or substantially different values of the Young modulus may be efficiently suppressed. This results in a reliable component carrier.

In an embodiment, the manufactured component carrier is substantially warpage-free. Therefore, the component carrier as a whole may be free of warpage or may show only very small amount of warpage thanks to the above-described manufacturing method.

In an embodiment, the component (in particular being embedded in the component carrier described in the previous paragraph) intrinsically comprises warpage. The term "intrinsically comprising warpage" may particularly denote the fact that the isolated component as such shows bending. This bending or warpage can however be removed provisionally by adhering such a component to a flat base structure and can be removed permanently when the component on the base structure is pressed into the component fixation structure while or before the latter is hardened by curing. In other words, the component may intrinsically show warpage which is however provisionally removed by mounting the component on a planar sticky surface of the carrier and is permanently removed by the transfer and fixation of the so planarized component by forcing it only partially into the component fixation structure. After that, the component does not show any warpage any longer when embedded in the component carrier.

In an embodiment, the component carrier comprises a shielding structure configured for shielding electromagnetic radiation (in particular in the radio frequency range, for instance above 1 GHz) from propagating from an exterior of the component carrier to the embedded component (or in opposite direction) and/or from the component to an exterior thereof (for instance to another component also embedded in the component carrier and/or to an exterior of the component carrier). Consequently, an efficient EMI (electromagnetic interference) protection may be accomplished.

In an embodiment, the component carrier comprises a heat removal structure configured for removing heat from the component during operation of the component carrier. When surrounded at least partially by highly thermally conductive material such as copper, heat generated by the component during operation may be efficiently removed or dissipated from the component carrier and/or heat spreading may be accomplished. This reduces issues with thermal mismatch, thermally induced tension, or the like and may result in a reliably operating component carrier without tendencies of delamination or warpage.

In an embodiment, the component carrier comprises at least one further (embedded or surface mounted) component stacked and electrically connected with the component. For instance, a first component may be a microprocessor and a second component may be a memory or MEMS (microelectromechanical system) functionally cooperating with the microprocessor. The described concept allows the stacking of multiple components in one and the same component carrier as well as a lateral arrangement thereof.

In an embodiment, at least part of the interconnected stack forms a flex board section. In particular when the base structure is formed of flexible component carrier material such as polyimide, a component carrier being flexible as a whole may be obtained. In other embodiments, the component carrier is embodied as a rigid component carrier. Also, rigid-flex carriers can be manufactured in the described way, in which one portion of the component carrier is flexible and another portion thereof is rigid.

In an embodiment, the thickness of the component fixation structure under the component is in a range between 1 µm and 50 µm, in particular in a range between 2 µm and 10 µm. Such a small remaining thickness between the bottom of the embedded component and the base structure being formed by material of the component fixation structure (thereby serving as a spacer) allows for a very simple formation of contacts there through for contacting the embedded component.

In an embodiment, the component carrier comprises at least one electrically conductive contact structure electrically connecting the embedded component. Such an electrically conductive contact structure may be embodied as a contact hole at least partially filled with electrically conductive material and extending at least partially through the interconnected stack up to the component (in particular as a vertical interconnect structure). Additionally or alternatively, one or more electrically conductive contact structures may be provided which are configured as patterned electrically conductive layer structure(s) (such as one or more patterned copper foils) on or above and electrically connected with the component (for instance forming part of the stack or being provided separately from the stack).

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guiding element (for example an optical waveguide or a light conductor connection), and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the semifinished product or the component carrier comprises a stack of at least one electrically insulating layer structure and at least one electrically conductive layer structure. For example, the component carrier may be a laminate of the mentioned electrically insulating layer structure(s) and electrically conductive layer structure (s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the semifinished product or the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the semifinished product or the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the component fixation structure comprises or consists of the same material, in particular the same resin, as at least one of the base structure and the at least one electrically insulating layer structure. This reduces thermally induced tension within the component carrier.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the semifinished product or the component carrier is a laminate-type body. In such an embodiment, the semifinished product or the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF THE ILLUSTRATED EMBODIMENTS

Figure 1:
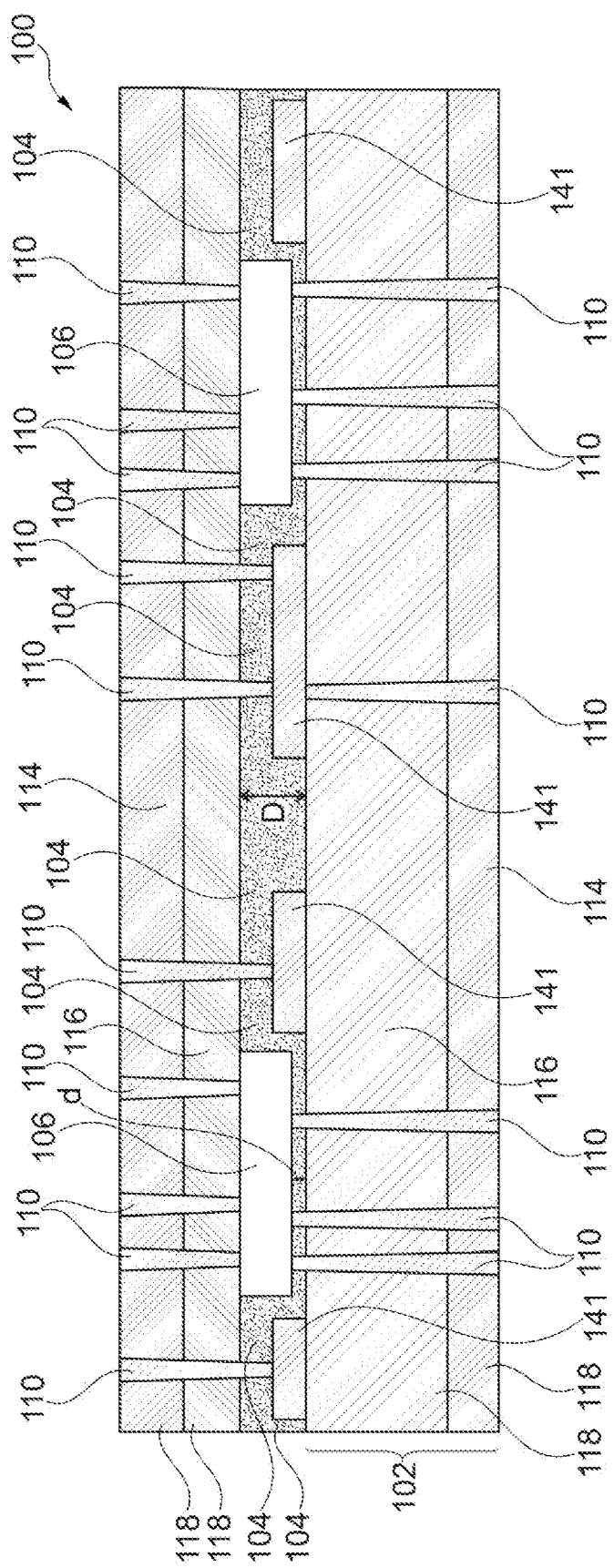
FIG. 1 illustrates a cross-sectional view of a component carrier according to an exemplary embodiment of the invention.

The illustrations in the drawings are schematic. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of embedding a component showing warpage is provided. Such a method can however also be carried out for a component which does not show warpage.

Components showing warpage are a significant issue when they shall be embedded in a component carrier such as a printed circuit board (PCB). In particular, this may cause problems when picking and placing components with warpage. Conventionally, there is no reasonable opportunity to integrate a component with warpage into a PCB. A reason for this is that embedding a component with warpage into a component carrier such as a PCB usually translates into warpage of the component carrier as a whole. This can result in damage of the component. A further issue is that the formation of contacts for electrically and/or thermally contacting such an embedded component showing warpage is very difficult, in particular as a consequence of various deviations of the dielectric material from desired properties.

According to an exemplary embodiment of the invention, a planar component or a component showing warpage is mounted on a (in particular temporary) carrier. On a base structure (which can for instance be embodied as core or multi-layer structure), a component fixation structure (for instance a resin foil or resin sheet, which may have a thickness preferably in a range between 5 µm and 20 µm) may be applied on a surface of a base structure (on one main surface or on both opposing main surfaces). Subsequently, the carrier with the mounted component(s) and the base structure with the component fixation structure may be interconnected. This can be done, for instance, with material in B-stage, soft lam and/or a final curing of the resin foil. Subsequently, the obtained multi-layer component carrier pre-form may be further processed. Such a manufacturing architecture allows the embedding of components with warpage while obtaining a component carrier being free of warpage or showing a very small amount of warpage only. This enables to carry out in particular a chip middle embedding design, when the component is embodied as an electronic chip. Such an embedding procedure can be carried out not only for components showing warpage but also for components being free of warpage. The components are not embedded chip first, but chip middle, which may result in an improvement of the yield.

When assembling a component with warpage in a component carrier according to an exemplary embodiment of the invention, this can be carried out by mounting one or more components on one or both opposing main surfaces of a base structure covered at least partially with material of a component fixation structure. Such a manufacturing architecture can be applied to components showing warpage, for instance warpage in a range between 2% and 15%. In this context, the percentage of warpage may be defined as a warpage related deviation of the thickness per length of the component in a plane perpendicular to the thickness. For instance, it is also possible to embed components without warpage or with a warpage of less than about 0.5%. The components to be embedded may for instance have a thickness below 40 µm which is properly compatible with an embedding process without cavity. When the thickness of the component is larger than 40 µm, embedding with or without cavity may be possible. The component fixation structure may be embodied as a resin sheet which may be applied on a whole main surface of the base structure, or only partially (which can be ensured by the use of a printing stamp or the like).

Implemented electrically conductive layer structures may be copper foils. They may have a thickness in a range of for example 2 µm to 500 µm. They may be used also in conjunction with transfer embedding. The components may be assembled face up and/or face down, i.e., having one or more pads oriented towards the component fixation structure or remaining outside of the component fixation structure. With the described manufacturing process, also flex boards may be manufactured, which may use a combination of copper and polyimide material. The base structure may be a thin core or multi-layer structure having a thickness in a range between 20 µm and 300 µm. This is compatible both with a face up and/or a face down configuration of the component. Advantageously, one or more contact holes may be predrilled in the base structure prior to the interconnection so that damage or deterioration of the component due to the formation of thick contact holes after interconnection may be prevented. It is possible to equip also the base structure with electrically conductive layer structures such as made of copper. With a core or multi-layer comprising copper of a thickness of for instance 250 µm, in particular a face up assembly can be carried out advantageously. When using a core or multi-layer structure without copper, a face up or face down assembling is possible. A resin material which may form the component fixation structure may be applied on a surface of the base structure which may comprise metal, glass, PCB material, substrate material, ceramic material, polyimide, IMS material, aluminium and/ or flex material.

FIG. 1 illustrates a cross-sectional view of a component carrier 100 according to an exemplary embodiment of the invention.

The illustrated plate-shaped and laminate-type component carrier 100, which is here embodied as printed circuit board (PCB), comprises an interconnected stack 118 comprising electrically insulating layer structures 116 (such as foils of resin, in particular epoxy resin, with reinforcing particles, in particular glass fibers, therein; they can be prepreg structures, RCF structures, or may be embodied as pure resin sheets) and electrically conductive layer structures 114 (such as continuous and/or patterned metal layers such as copper sheets, and vertical interconnects such as copper filled laser vias).

Moreover, a layer-type component fixation structure 104 is arranged in the stack 118 and is here embodied as a resin sheet.

Furthermore, two electronic components 106, such as semiconductor chips, are embedded in the stack 118 and extend partially into the component fixation structure 104. Lower surfaces of the components 106 are vertically spaced with regard to an upper surface of base structure 102 by a gap (filled with material of the component fixation structure 104) of a distance, d. Upper surfaces of the components 106 are in direct contact with the electrically insulating layer structure 116 above them. In other words, the electronic components 106 are pressed into the component fixation structure 104 but not fully extend through the entire component fixation structure 104, but only through part thereof. As a consequence, a thin film of the resin material of the component fixation structure 104 remains under the electronic components 106 which also have their upper main surfaces being exposed from and being in flush with the upper surface of the component fixation structure 104. The thickness, d, of the component fixation structure 104 under the component 106 may for example be 5 µm. The maximum thickness, D, of the component fixation structure 104 in a portion juxtaposed to the component 106 may for example be in the order of magnitude between several micrometers and several ten micrometers, depending on the thickness of the components 106. Electrically conductive traces 141 are formed on the top surface of underlying electrically insulating layer structure 116 and also extend into the component fixation structure 104 from the opposite side than the components 106.

A plurality of contact holes 110 (for instance formed by laser drilling), which are shown in FIG. 1 as well, are formed in base structure 102, on which the component fixation structure 104 and above which the electronic components 106 are arranged, before the covering with the component fixation structure 104. The base structure 102 is here embodied as an electrically insulating layer structure 116 which may be made of prepreg, covered on both opposing main surfaces with copper. The contact holes 110 are filled (for instance by plating) with electrically conductive material (in particular copper) after interconnection by lamination. The contact holes 110 may be formed prior to the application of the component fixation structure 104 and may later serve for contacting of the components 106. After the final lamination, it is then sufficient to post-process the already formed contact holes 110 (for instance by a further laser procedure, before they are filled with electrically conductive material such as copper, for example by plating). The formation of contacts may be carried out by a combination of a laser process, a plasma process and a photovia process. The contact holes 110 form electrically conductive contact structures electrically connecting the embedded components 106 with an electronic environment. Additionally or alternatively to the provision of the metal filled contact holes 110, it is also possible to provide one or more patterned electrically conductive layer structures (not shown in FIG. 1) on or above and electrically connected with the components 106.

As can be taken from FIG. 1, a thickness of the layer-type component fixation structure 104 under the component 106 and being denoted as d is smaller than a larger thickness, D, of the component fixation structure 104 apart from the position of the component 106. The fact that the component fixation structure 104 is present both beneath the component 106 and laterally adjacent thereto ensures a highly reliable integration of the component 106 into the component fixation structure 104. The fact that the thickness, d, beneath the component 106 is very small simplifies contacting the component 106 after embedding.

In the configuration shown in FIG. 1, the component carrier 100 is warpage-free, even if one or both of the thin electronic components 106 shows warpage as such. This results in particular from the fact that, during manufacture of the component carrier 100 shown in FIG. 1, the electronic components 106 are glued onto a temporary carrier 108, as will be described below. Thus, the embodiment of FIG. 1 removes warpage of the component 106 by mounting the component 106 on the carrier 108 and by later removing the carrier 108 before completing manufacture of the component carrier 100. The components 106 embedded in the component carrier 100 according to FIG. 1 can show warpage before mounting (see the left component 106 in FIG. 10) which is however no longer present after the embedding as a consequence of mounting the components 106 on temporary carrier 108 during manufacture and later immobilizing the components 106 in the component fixation structure 104 by lamination.

FIG. 2 to FIG. 6 illustrate cross-sectional views of component carriers 100 or preforms thereof according to other exemplary embodiments of the invention.

Figure 2:
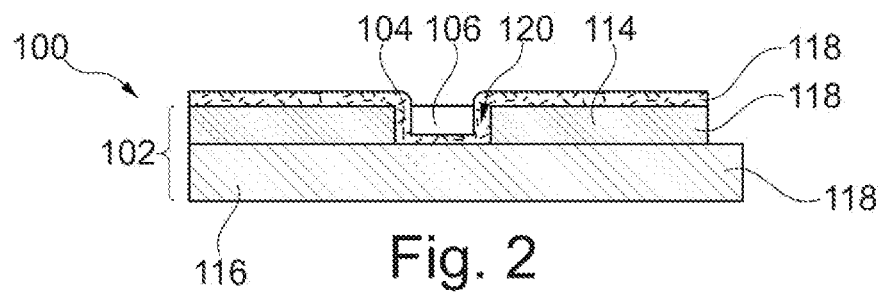
FIG. 2, FIG. 3, FIG. 4, FIG. 5 and FIG. 6 illustrate cross-sectional views of component carriers or preforms thereof according to other exemplary embodiments of the invention.

The component carrier 100 shown in FIG. 2 comprises a patterned copper foil as electrically conductive layer structure 114 having a cavity 120 for accommodating the component 106. The component fixation structure 104 is here embodied as a layer of originally homogeneous thickness and made of a homogeneous material, wherein, after embedding the component 106 in the cavity 120, the component fixation structure 104 has locally a smaller thickness beneath the component 106 than on sidewalls of the electrically conductive layer structure 114 and on a top wall of the electrically conductive layer structure 114. For instance, the component fixation structure 104 may have a thickness in a range between 2 μm and 30 μm, whereas a thickness of the electrically conductive layer structure 114 in FIG. 2 may be in a range between 1 μm and 200 μm. According to FIG. 2, the component 106 is fully arranged in blind hole type cavity 120 of the base structure 102.

Figure 3:
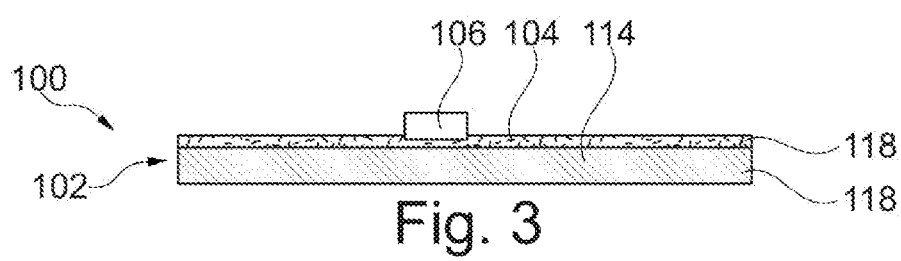

In the embodiment of FIG. 3, the component 106 is arranged on a planar base structure 102 with component fixation structure 104 being embodied as a flat layer of homogeneous material and homogeneous thickness prior to the mounting of the component 106 thereon. As a consequence of this mounting, the thickness of the component fixation structure 104 beneath the component 106 becomes smaller than its thickness around the component 106.

Figure 4:
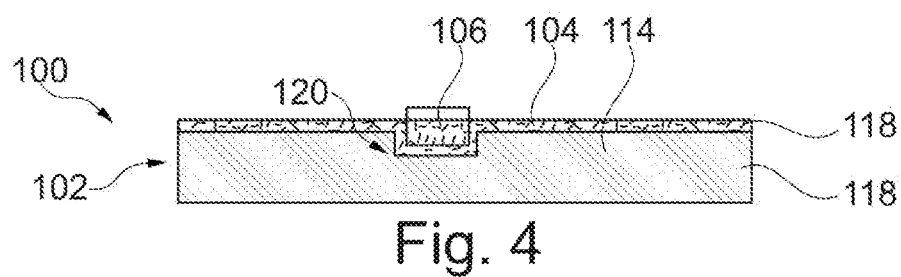

The embodiment of FIG. 4 shows an electrically conductive layer structure 114 of the base structure 102 having a cavity 120 in which the component 106 is only partially embedded in a height direction, to that another part of the component 106 vertically protrudes beyond the electrically conductive layer structure 114. The electrically conductive material of the electrically conductive layer structure 114 accomplishes both a shielding against electromagnetic radiation and an efficient heat removal.

Figure 5:
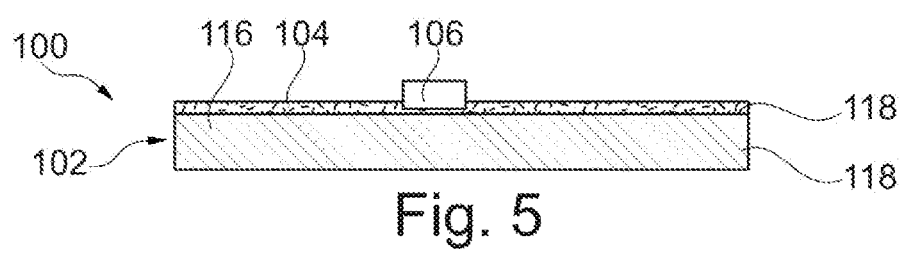

The embodiment according to FIG. 5 corresponds to the embodiment of FIG. 3 with the difference that an electrically insulating layer structure 116 is used for providing the base structure 102 according to FIG. 5, rather than an electrically conductive layer structure 114 as in FIG. 3. The electrically insulating layer structure 116 according to FIG. 5 may comprise core material (for instance FR4), IMS material, polyimide material, etc.

Figure 6:
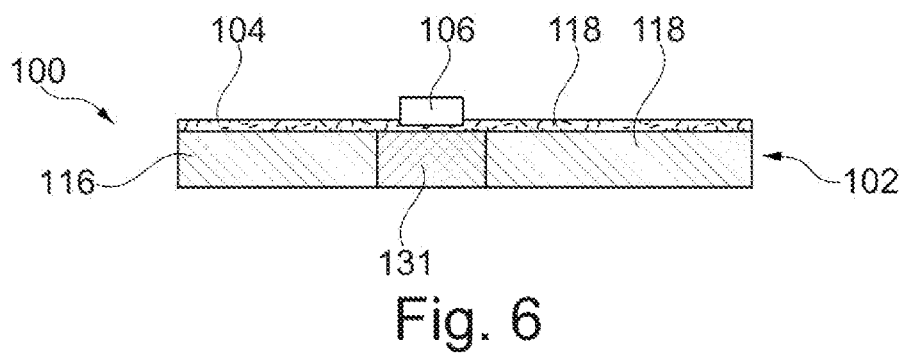

According to the embodiment of FIG. 6, a component carrier 100 is shown in which the base structure 102 is embodied as an electrically insulating layer structure 116 having, in a central portion thereof corresponding to a position of the component 106, an inlay 131 of thermally highly conductive material such as copper. Thus, the heat removal capability of the embodiment of FIG. 6 is very high. Apart from this, the embodiment of FIG. 6 corresponds to the embodiment of FIG. 5.

Figure 7:
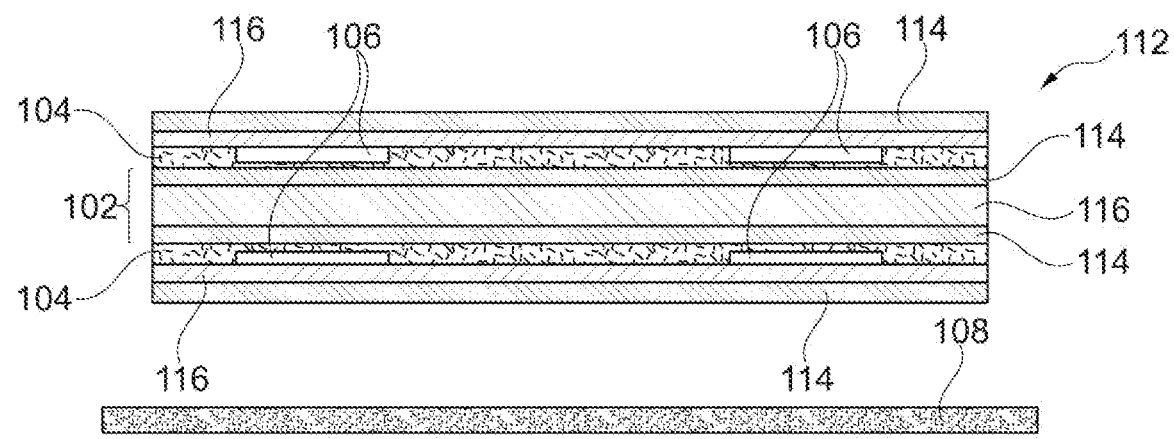
FIG. 7 illustrates a cross-sectional view of a semifinished product obtained during manufacturing a component carrier according to an exemplary embodiment of the invention.

FIG. 7 illustrates a cross-sectional view of a semifinished product 112 obtained during manufacturing a component carrier 100 according to an exemplary embodiment of the invention.

The shown semifinished product 112 comprises base structure 102 embodied as an electrically insulating layer structure 106 in form of a core of fully cured FR4 material, covered by a respective copper foil as electrically conductive layer structure 114 on both opposing main surfaces of the electrically insulating layer structure 116. As can be taken from FIG. 7, each of the two opposing main surfaces of the base structure 102 is covered by a respective resin sheet as respective component fixation structure 104 within which altogether four components 106 and fused. Several electrically insulating layer structures 116 and electrically conductive layer structures 114 are laminated on the previously exposed surfaces of the component fixation structures 104 and the electronic components 106 to obtain the configuration of FIG. 7.

Figure 10:
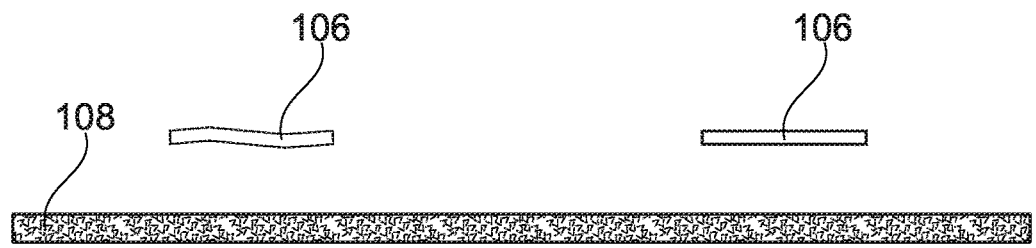
FIG. 10 and FIG. 11 show cross-sectional views of structures obtained during mounting components with or without warpage during manufacturing a component carrier according to the embodiment of FIG. 8 and FIG. 9.
Figure 11:

Moreover, a temporary carrier 108 is shown and provided for temporarily carrying components 106, which may show warpage before being mounted on the temporary carrier 108 (compare FIG. 10 and FIG. 11).

In the semifinished product 112 according to FIG. 7, the temporary carrier 108 has already been removed from the components 106 close to a bottom surface of the semifinished product 112. Correspondingly, another temporary carrier 112 (not shown) has already been removed from the components 108 close to a top surface of the semifinished product 112. In the embodiment of FIG. 7, components 106 may be mounted on both opposing main surfaces of the base structure 102.

Figure 8:
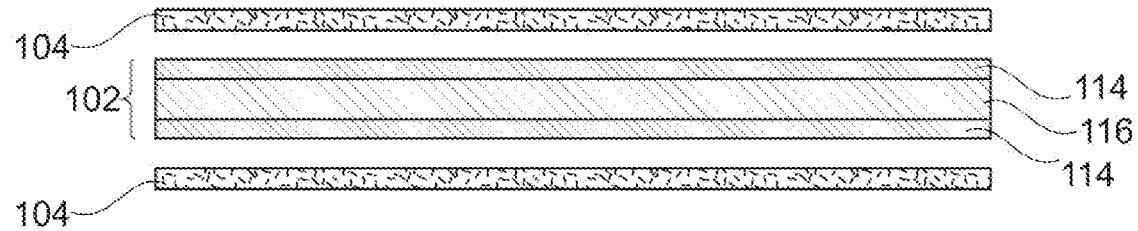
FIG. 8 and FIG. 9 show cross-sectional views of structures obtained during applying component fixation structures on both opposing main surfaces of a base structure according to an exemplary embodiment of the invention.
Figure 9:
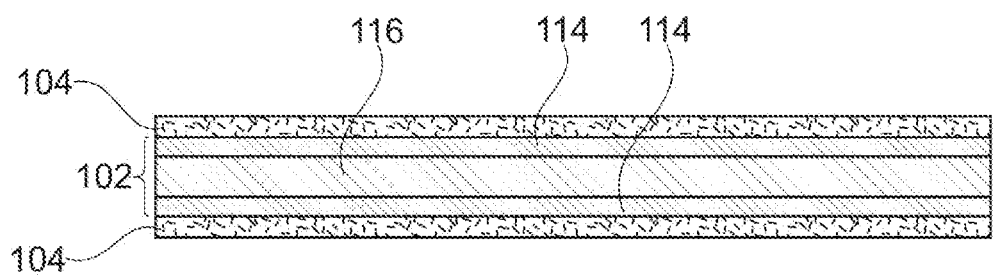

FIG. 8 and FIG. 9 show cross-sectional views of structures obtained during applying component fixation structures 104 on both opposing main surfaces of a base structure 102 according to an exemplary embodiment of the invention.

Referring to FIG. 8, two exposed opposing main surfaces of the base structure 102 are covered with uncured resin material as respective component fixation structure 104. In the shown embodiment, a respective uncured resin foil is used as component fixation structure 104. In contrast to this, the base structure 102 is here made of a fully cured material such as FR4 covered with copper foils.

In FIG. 9, the result of the process of covering the opposing main surfaces of the base structure 102 by the component fixation structure 104 is illustrated.

FIG. 8 and FIG. 9 hence illustrate the process of core preparation, i.e., coverage of both opposing main surfaces of base structure 102 with a respective layer of material of the component fixation structure 104. Two layers of homogeneous thickness and homogeneous material (resin in the shown embodiment) are attached to both opposing main surfaces of the core 102 to thereby cover both surfaces with a respective component fixation structure 104. The structure of FIG. 9 will be used as a first preform body for manufacturing the component carrier 100 of FIG. 13.

FIG. 10 and FIG. 11 show cross-sectional views of structures obtained during mounting components 106 with (see left hand side of FIG. 10) or without (see right hand side of FIG. 10) warpage during manufacturing a component carrier 100 in combination with the processes of FIG. 8 and FIG. 9.

Referring to FIG. 10, the temporary carrier 108 is shown prior to attachment of one still warpage comprising electronic component 106 (left hand side) and of one flat electronic component 106 without warpage (right hand side). The temporary carrier 108 will be later removed before completing manufacture of the component carrier 100.

Referring to FIG. 11, the result of the mounting of the electronic components 106 of FIG. 10 on the flat temporary carrier 108 with sticky surface is shown. When being adhered to the temporary carrier 108, both electronic components 106 show no warpage any longer.

The structure of FIG. 11 will be used as a second preform body for manufacturing the component carrier 100 of FIG.

13. For forming the second preform body in terms of component carrier manufacture, FIG. 10 and FIG. 11 show how the components 106 are mounted to a respective adhesive surface of a respective carrier 108. The component 106 shown on the left-hand side of FIG. 10 shows warpage, whereas the component 106 on the right-hand side of FIG. 10 has no warpage. After having adhered the components 106 on the sticky surface of the carrier 108, the warpage is removed provisionally. FIG. 10 and FIG. 11 therefore show that exemplary embodiments of the invention allow both the assembly of a component 106 with warpage and a component 106 without warpage.

Figure 12:
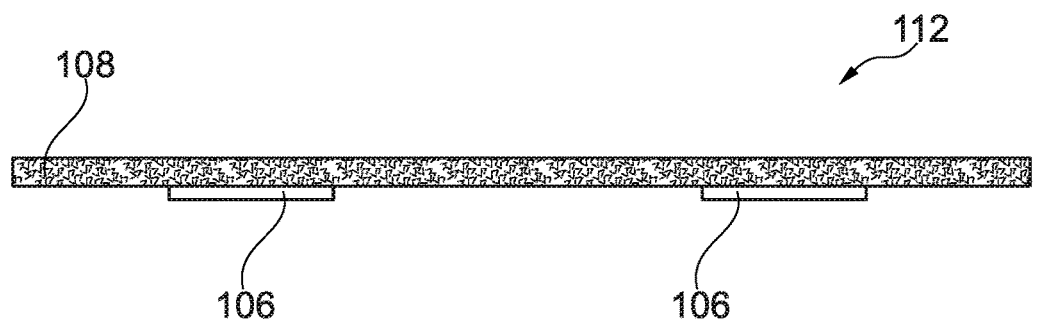
FIG. 12 illustrates a cross-sectional view of a semifinished product according to an exemplary embodiment obtained by combining the structures manufactured according to FIG. 8 and FIG. 9 and manufactured according to FIG. 10 and FIG. 11.
Figure 12:
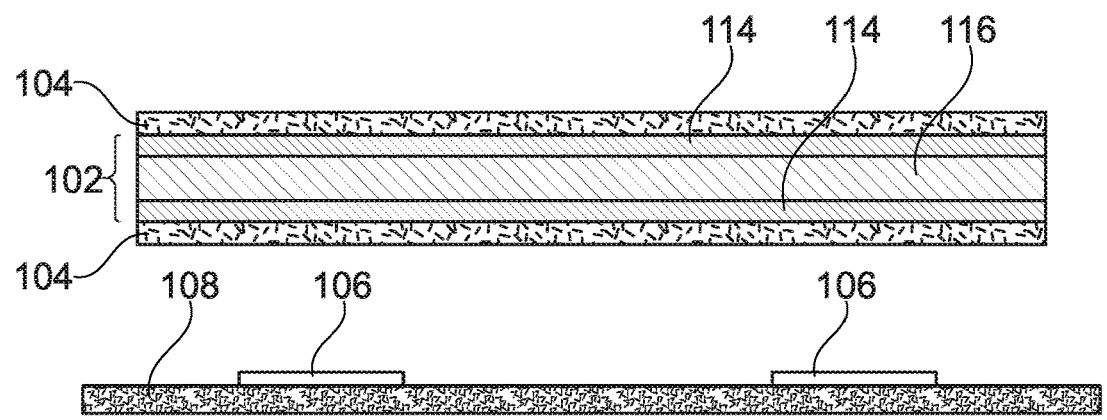
Figure 13:
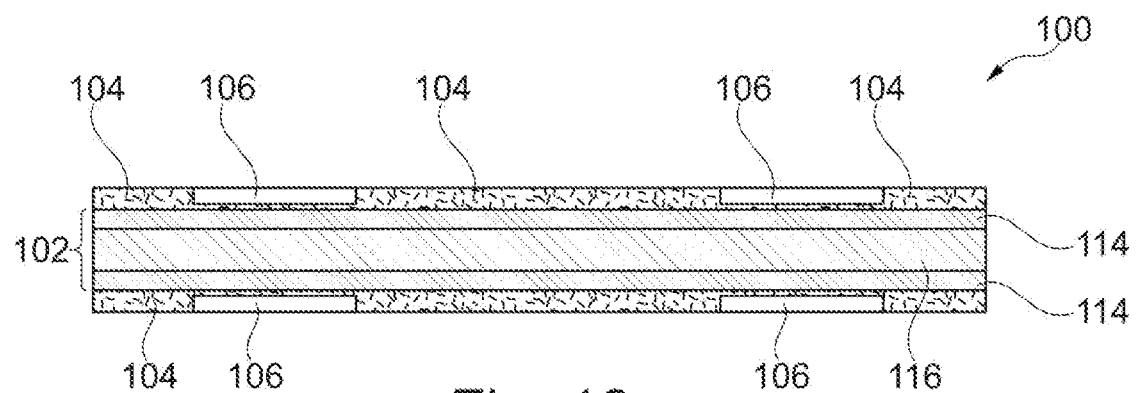
FIG. 13 illustrates a component carrier according to an exemplary embodiment of the invention obtained after removing temporary carriers from the semifinished product shown in FIG. 12.

FIG. 12 illustrates a cross-sectional view of a semifinished product 112 according to an exemplary embodiment obtained by combining the first preform body manufactured according to FIG. 8 and FIG. 9 and two second preform bodies manufactured according to FIG. 10 and FIG. 11. The three preform bodies are interconnected by lamination, i.e., pressure optionally accompanied by heat. FIG. 13 illustrates a component carrier 100 according to an exemplary embodiment of the invention obtained after lamination and after subsequent removal of the temporary carriers 108 from the semifinished product 112.

As can be taken from a comparison of FIG. 11 and FIG. 12, the upper carrier 108 according to FIG. 12 with the components 106 mounted thereon is flipped or turned around by 180° before the interconnecting (compare FIG. 13) with the base structure 102 covered with the component fixation structure 104. By taking this measure, it is dispensable that the components 106 are assembled separately by a pick and place assembly on the component fixation structure 104. In contrast to this, it is possible to perform the interconnection procedure simultaneously with a large number of components 106 (for instance more than 100, for example 20,000) attached to the carrier 108.

As seen in FIG. 12 and FIG. 13, the base structure 102 with component fixation structures 104 is interconnected with carrier 108 and components 106 so that the components 106 extend only partially into the respective component fixation structure 104. The component carrier 100 according to FIG. 13 is obtained by interconnecting (more precisely laminating, i.e. the application of mechanical pressure and thermal heat) the base structure 102, covered by the component fixation structures 104, with the temporary carriers 108 with the components 106 mounted thereon so that the components 106 extend partially into the respective component fixation structure 104. For obtaining the integral structure according to FIG. 13, material of the component fixation structure 104 is re-melted and subsequently re-solidified during laminating so that the components 106 are fused or integrally fixed into the component fixation structures 104. During this procedure, the previously uncured resin material of the component fixation structures 104 cross-links and thereby fully cures and hardens. Thereafter, the temporary carriers 108 are removed, and as a result the component carrier 100 of FIG. 13 is obtained.

Figure 14:
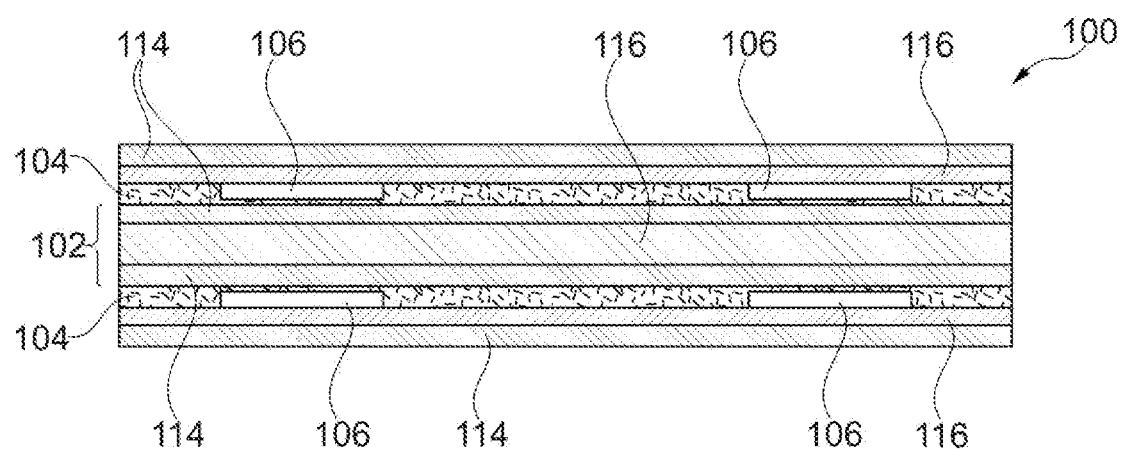
FIG. 14 illustrates a component carrier according to another exemplary embodiment of the invention obtained after having interconnected a plurality of electrically insulating layer structures and a plurality of electrically conductive layer structures on the exterior main surfaces of the component carrier according to FIG. 13.

FIG. 14 illustrates a component carrier 100 according to another exemplary embodiment of the invention obtained after having interconnected a plurality of further electrically insulating layer structures 116 and a plurality of further electrically conductive layer structures 114 on the component carrier 100 according to FIG. 13.

FIG. 14 shows the obtained component carrier 100 after having laminated two further electrically conductive layer structures (such as copper foils) 114 and two further electrically insulating layer structures 116 (such as prepreg layers, RCF, resin sheets, etc.) on the two opposing main surfaces of the component carrier 100 shown in FIG. 13. Therefore, FIG. 14 shows the result of a further build-up.

Figure 15:
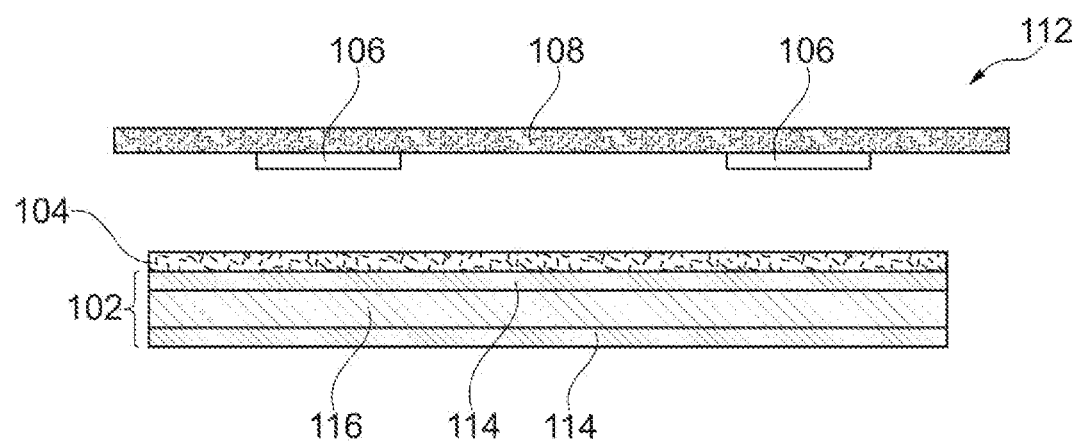
FIG. 15 and FIG. 16 illustrate semifinished products according to exemplary embodiments of the invention obtained during manufacturing a respective component carrier.
Figure 16:
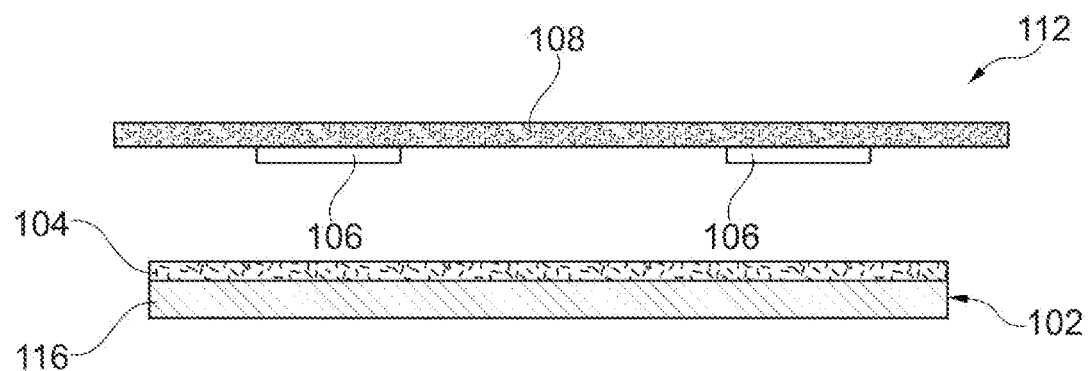

FIG. 15 and FIG. 16 illustrate semifinished products 112 according to other exemplary embodiments of the invention obtained during manufacturing a respective component carrier 100.

FIG. 15 shows a semifinished product 112 manufactured in a similar way as described referring to FIG. 12 with the difference that a carrier 108 with components 106 mounted thereon is attached only to one main surface of the base structure 102 covered with component fixation structure 104. Correspondingly, another main surface of the base structure 102 of FIG. 15 remains free of a component fixation structure 104. According to FIG. 15, the base structure 102 comprises a core covered with copper layers on both opposing main surfaces thereof.

The embodiment of FIG. 16 differs from the embodiment of FIG. 15 in that the base structure 102 consists of a core only, i.e., is provided without copper foils.

Figure 17:
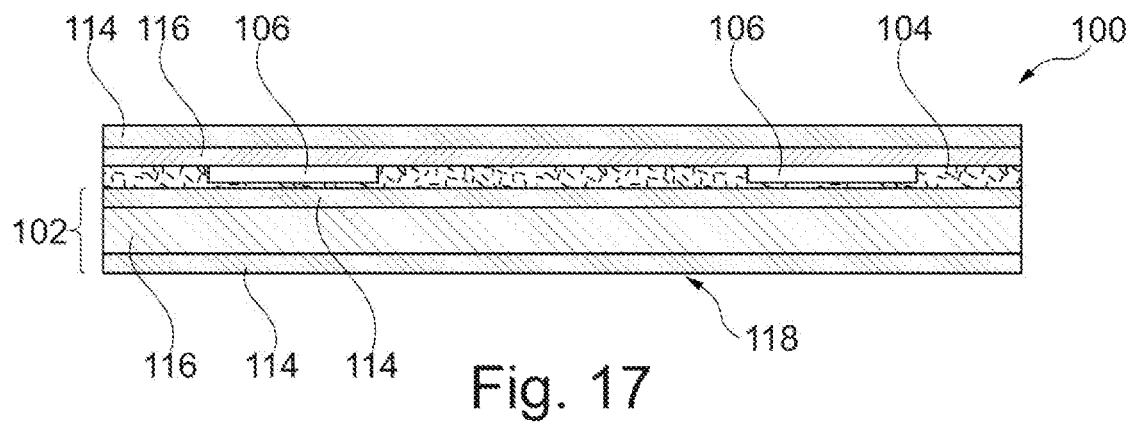
FIG. 17, FIG. 18 and FIG. 19 illustrate cross-sectional views of component carriers according to exemplary embodiments of the invention differing concerning a respective composition of a supporting stack of layer structures.
Figure 18:
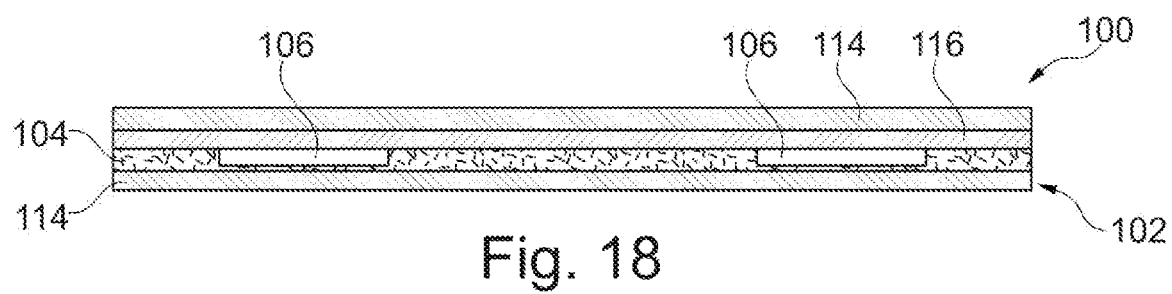
Figure 19:
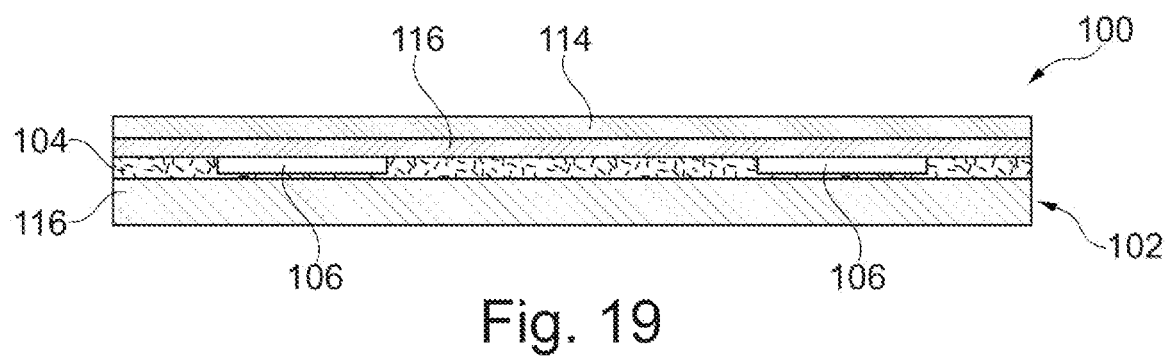

FIG. 17 to FIG. 19 illustrate cross-sectional views of component carriers 100 according to exemplary embodiments of the invention differing concerning a respective composition of a supporting stack 118 of layer structures (compare reference numerals 114, 116, 104). FIG. 17 shows the result obtained when pressing the two preform bodies shown in FIG. 15 together, followed by a removal of the carrier 108 and a lamination of further layer structures 114, 116 onto a top surface of the component carrier 100. Correspondingly, FIG. 18 shows a component carrier 100 with a more compact base structure 102 than in FIG. 17, i.e., a base structure 102 consisting of an electrically conductive layer structure 114 (for instance a copper foil). Accordingly, FIG. 19 shows a component carrier 100 in which the electrically conductive layer structure 114 is substituted by a base structure 102 consisting of an electrically insulating layer structure 116 (such as a core made of FR4).

Figure 20:
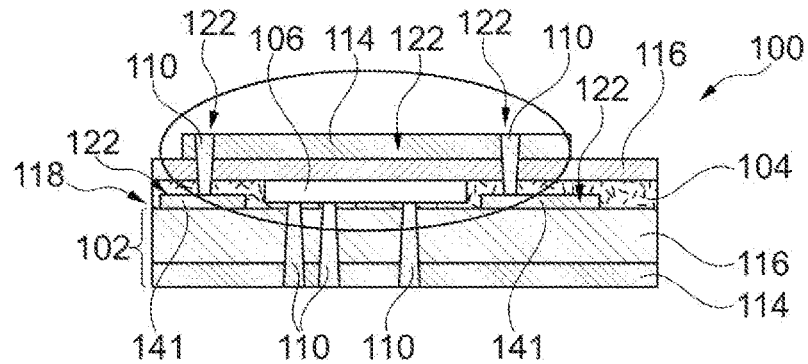
FIG. 20 illustrates a cross-sectional view and FIG. 21 illustrates a plan view of a component carrier according to an exemplary embodiment of the invention having an electromagnetic radiation shielding capability.
Figure 21:
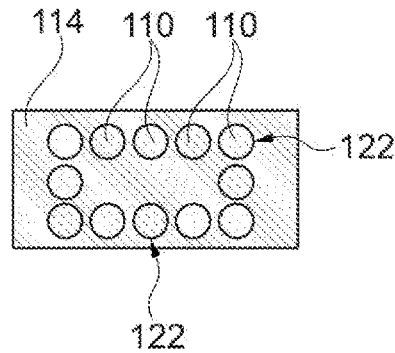

FIG. 20 illustrates a cross-sectional view of a component carrier 100 and FIG. 21 illustrates a plan view of a part of the component carrier 100 according to an exemplary embodiment of the invention having an electromagnetic radiation shielding capability. The component carrier 100 shown in FIG. 20 and FIG. 21 comprises a metallic (in particular ferromagnetic) shielding structure 122 configured for shielding electromagnetic radiation from propagating from an exterior of the component 106 (for instance from an exterior of the component carrier 100 and/or from another component 106 of the component carrier 106) to the component 106 and/or from the component 106 to an exterior of the component 106 (for instance to an exterior of the component carrier 100 and/or to another component 106 of the component carrier 106).

The embodiment of FIG. 20 and FIG. 21 shows a full EMI (electromagnetic interference) shielding supported by copper filled vias or slits. Thus, the copper posts shown in FIG. 21 serve as electromagnetic radiation absorbing columns which cooperate with electromagnetic radiation absorbing metallic layers above and beneath these columns. Conductive traces 141 of the PCB type component carrier 100 are shown as well.

Figure 22:
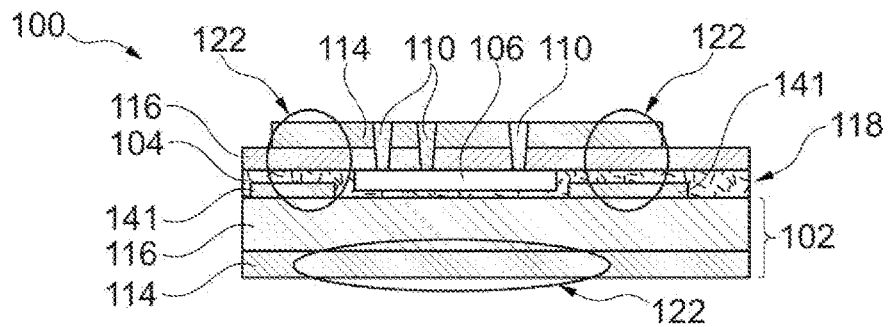
FIG. 22 and FIG. 23 are cross-sectional views of component carriers according to other exemplary embodiments of the invention having an electromagnetic radiation shielding capability.
Figure 23:
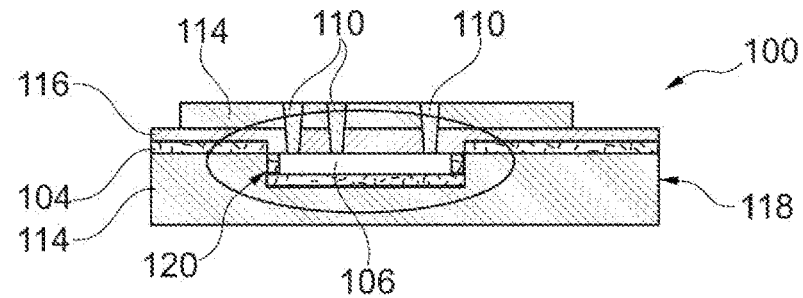

FIG. 22 and FIG. 23 are cross-sectional views of component carriers 100 according to other exemplary embodiments of the invention having an electromagnetic radiation shielding capability in form of shielding structure 122. In contrast to FIG. 20 and FIG. 21, the embodiment of FIG. 22 only shows a partial shielding. In comparison to the embodiment of FIG. 22, the embodiment of FIG. 23 shows a full shielding using a cavity 120 defined by surrounding copper material.

Figure 24:
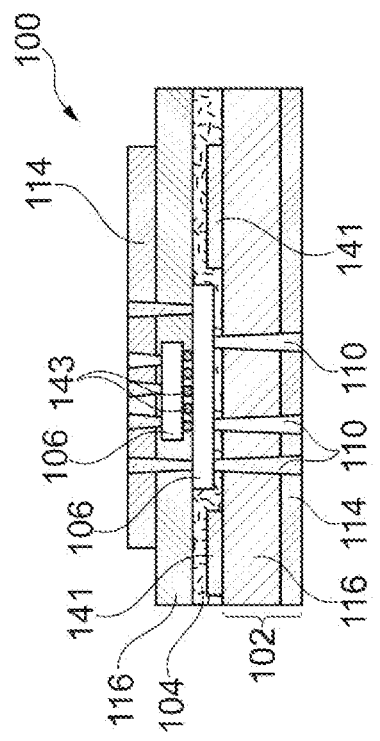
FIG. 24, FIG. 25 and FIG. 26 are cross-sectional views of component carriers according to other exemplary embodiments of the invention having a heat removal capability.
Figure 25:
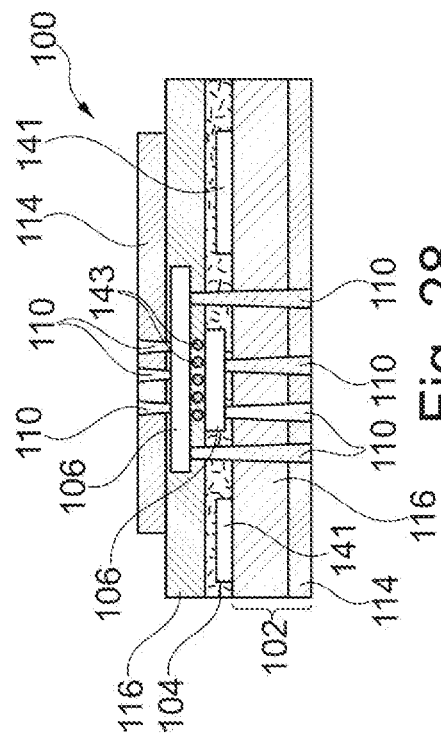
Figure 26:
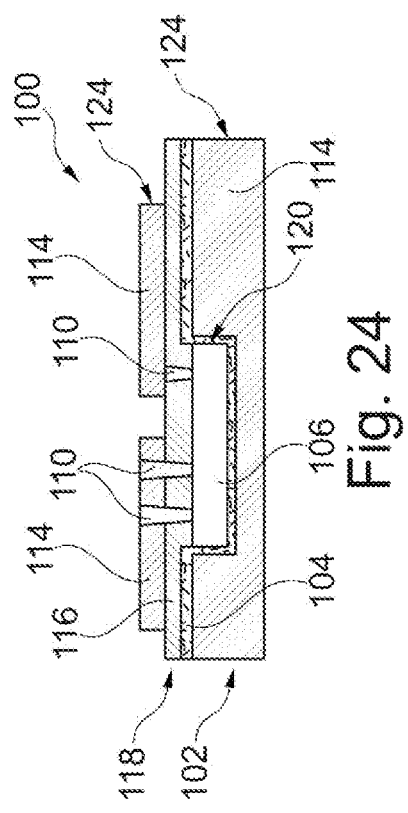

FIG. 24 to FIG. 26 are cross-sectional views of component carriers 100 according to other exemplary embodiments of the invention having a heat removal capability. In each of these embodiments, the component carrier 100 is equipped with a heat removal structure 124 being configured for removing heat from the component 106 during operation of the component carrier 100. The embodiments of FIG. 24 to FIG. 26 are provided for a proper heat transfer, i.e., for removing heat generated during operation of the component 106.

According to FIG. 24, the heat removal capability is dominated by the recessed copper block under the component 106 defining a cavity 120. FIG. 25 shows a heat removing embodiment in which a planar copper layer beneath the component 106 provides a significant contribution to heat removal. In FIG. 26, the component 106 itself is configured as a copper block promoting heat removal as well. It cooperates with a copper layer as electrically conductive layer structure 114 beneath the component 106 and separated therefrom by the resin layer constituting the component fixation structure 104.

Figure 27:
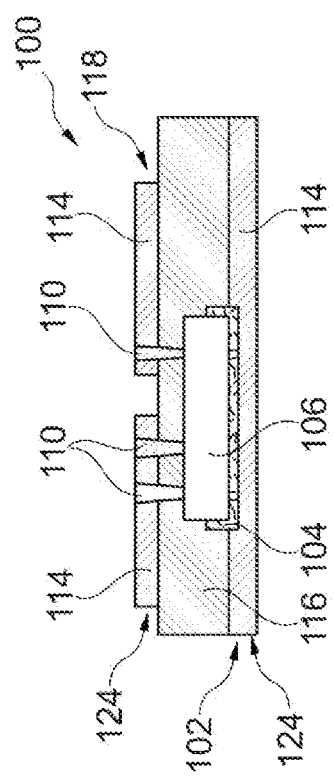
FIG. 27 and FIG. 28 are cross-sectional views of component carriers according to other exemplary embodiments of the invention having a stack of multiple components embedded therein.
Figure 28:
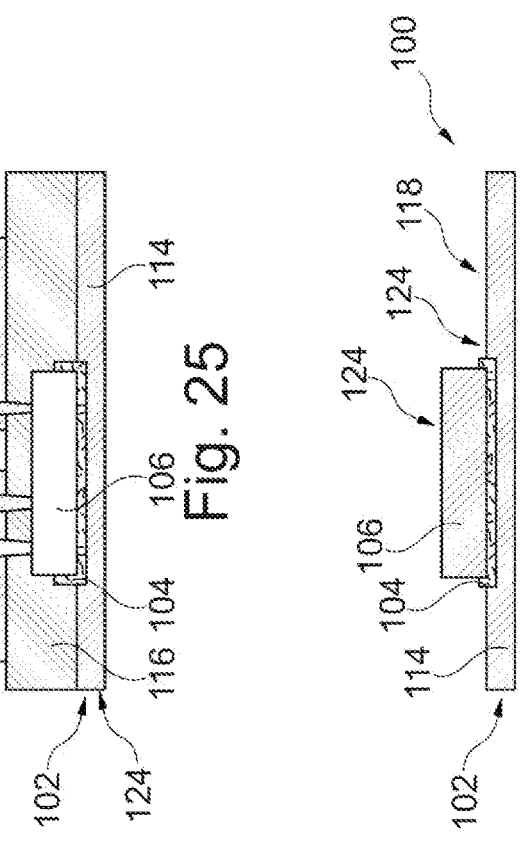

FIG. 27 and FIG. 28 are cross-sectional views of component carriers 100 according to other exemplary embodiments of the invention having a stack of multiple components 106 embedded in the respective component carrier 100. The component carriers 100 according to FIG. 27 and FIG. 28 hence comprise an additional further component 106 stacked and electrically connected with the component 106.

FIG. 27 and FIG. 28 show that multiple components 106 may be vertically stacked and may functionally cooperate. In the shown embodiments, the stacked components 106 are interconnected via a ball grid array 143. Thereby, it is ensured that the components 106 can functionally cooperate. For example, one of the two stacked components 106 may be a microprocessor, whereas the other one of the stacked components 106 may be a memory chip or MEMS chip.

Figure 29:
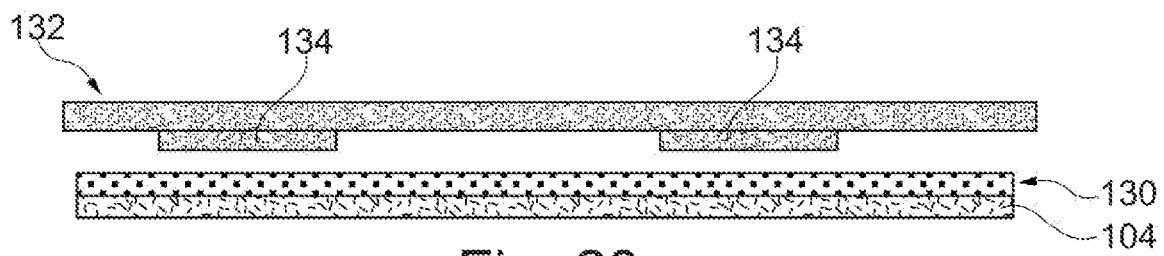
FIG. 29 illustrates a cross-sectional view of an auxiliary body and of a transfer body configured for transferring material of a component fixation structure onto a base structure according to an exemplary embodiment of the invention.
Figure 30:
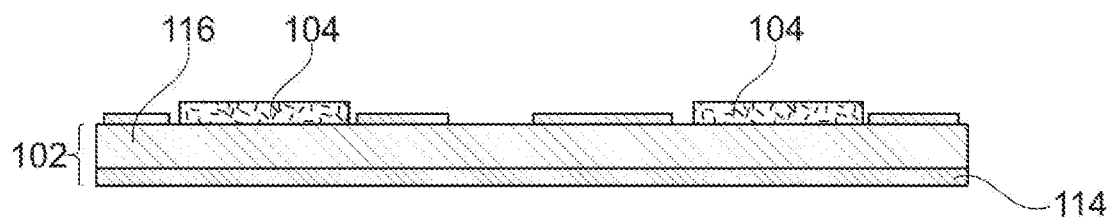
FIG. 30 shows a cross-sectional view of a base structure on which selective sections of material of a component fixation structure are applied according to FIG. 29.
Figure 31:
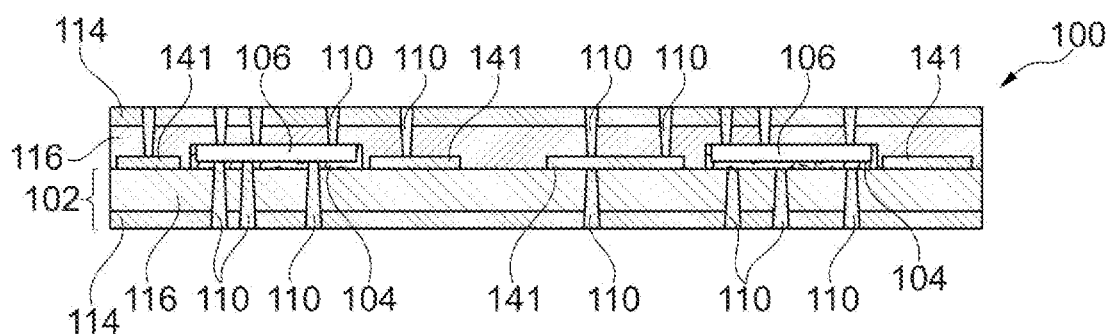
FIG. 31 shows a cross-sectional view of a component carrier according to an exemplary embodiment of the invention manufactured based on the structure shown in FIG. 30.

FIG. 29 illustrates a cross-sectional view of an auxiliary body 130 and of a transfer body 132 configured for transferring material of a component fixation structure 104 onto a base structure 102 according to an exemplary embodiment of the invention. FIG. 30 shows a cross-sectional view of a base structure 102 on which selective sections of material of a component fixation structure 104 are applied according to FIG. 29. FIG. 31 shows a cross-sectional view of a component carrier 100 according to an exemplary embodiment of the invention manufactured based on the structure shown in FIG. 30.

In the embodiment according to FIG. 29 to FIG. 31, it is possible to form the component fixation structure 104 selectively only on (here two) selective portions of a main surface of the base structure 102 by transferring material of the component fixation structure 104 on the main surface of the base structure 102 from auxiliary body 130 by transfer body 132 having (here two) protruding or elevated sections 134 corresponding to the (here two) portions of component fixation structure 104.

FIG. 29 shows an arrangement which may be used for applying resin material for forming component fixation structures 104 only on selected surface portions of base structure 102. This can be accomplished by a stamp or punch-like architecture, wherein protruding or elevated sections 134 transfer resin material onto the base structure 102, as shown in FIG. 30. This allows to arrange conductive traces 141 adjacent to laterally limited sections of the component fixation structure 104. This results in a compact design. FIG. 31 shows the result of such a procedure after having pressed the components 106 in the portions of the component fixation structure 104 and after having laminated electrically conductive layer structures 114 and electrically insulating layer structures 116 on the upper main surface of the structure shown in FIG. 30. Also, contact holes 110 may be drilled and filled with electrically conductive material.

Figure 32:
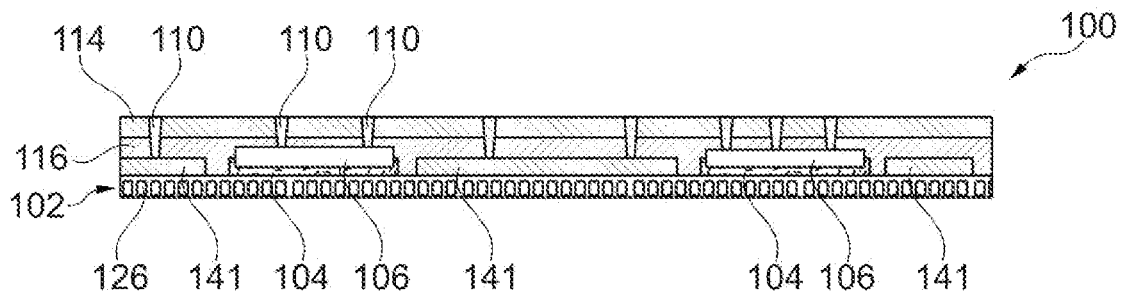
FIG. 32 shows a cross-sectional view of a component carrier according to an exemplary embodiment of the invention with a flexible base structure.

FIG. 32 shows a cross-sectional view of a component carrier 100 according to an exemplary embodiment of the invention with a flexible base structure 102. According to FIG. 32, the interconnected stack 118 forms a flex board section 126. The embodiment of FIG. 32 hence shows that the described manufacturing architecture is compatible with the formation of flex boards.

It should be noted that the term "comprising" does not exclude other elements or steps and the "a" or "an" does not exclude a plurality. Also, elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

In an example embodiment, a method of manufacturing a component carrier includes covering a main surface of a base structure at least partially by a component fixation structure, mounting a component on a carrier, and interconnecting the base structure with the carrier so that the component extends partially into the component fixation structure.

The method as described in the immediately preceding paragraph wherein the carrier is a temporary carrier that is removed before completing the component carrier.

The method as described in paragraph [00124] wherein the main surface of the base structure is covered at least partially with an at least partially uncured material as the component fixation structure.

The method as described in paragraph [00124], where the component fixation structure at least one of the group consisting of resin, in particular epoxy resin or Bismaleimide-Triazine resin, prepreg, cyanate ester, polyimide, acrylate, and prepreg.

The method as described in paragraph [00124], where the component fixation structure has a thickness in a range between 2 μm and 50 μm, in particular in a range between 5 μm and 20 μm.

The method as described in paragraph [00124], where the base structure is made of a fully cured material.

The method as described in paragraph [00124], where the base structure includes at least one of the group consisting of a core, a stack with at least one electrically insulating layer structure and/or at least one electrically conductive layer structure, and a metal foil.

The method as described in paragraph [00124] that further includes at least partially removing warpage of the component by mounting, in particular adhering, the component to the carrier.

The method as described in paragraph [00124] wherein the interconnecting is carried out by one of the group consisting of laminating and adhering.

The method as described in paragraph [00124] that further includes covering an opposing another main surface of the base structure at least partially by a further component fixation structure; mounting a further component on a further carrier; and interconnecting the base structure with the further carrier so that the further component extends partially into the further component fixation structure.

The method as described in paragraph [00124] that further includes forming at least one contact hole in the base structure before the covering with the component fixation structure; and filling the at least one contact hole at least partially with electrically conductive material after the interconnecting.

The method as described in paragraph [00124] wherein the method includes forming the component fixation structure selectively only on a portion of the main surface of the base structure, in particular by transferring material of the component fixation structure onto the main surface of the base structure from an auxiliary body by a transfer body having at least one elevated section corresponding to the portion of the main surface of the base structure to be selectively covered with the component fixation structure.

The method as described in paragraph [00124] further including at least one of the following features wherein the method comprises mounting the component on a flat carrier, in particular on a cavity-free carrier; wherein the method comprises re-melting and subsequently re-solidifying material of the component fixation structure during the interconnecting so that the component is integrally fixed with the component fixation structure; wherein the method comprises pressing the component partially into the component fixation structure and simultaneously and/or subsequently curing the component fixation structure so that the component is permanently immobilized within the cured component fixation structure; wherein the method comprises flipping the carrier with the component mounted thereon before the interconnecting with the base structure covered with the component fixation structure.

A semifinished product for manufacturing a component carrier where the semifinished product includes a base structure at least partially covered by a component fixation structure; a carrier with a component mounted thereon; wherein the base structure is interconnected or is to be interconnected with the carrier so that the component extends partially into the component fixation structure.

The semifinished product as described in the immediately preceding paragraph wherein the component is at least partially arranged in a cavity, in particular in a blind hole type cavity, of the base structure.

The semifinished product as described in paragraph [00137] including at least one of the following features: the semifinished product comprises at least one electrically conductive layer structure, in particular comprising at least one of the group consisting of copper, aluminum, nickel, silver, gold, palladium, and tungsten, any of the mentioned materials being optionally coated with supra-conductive material such as graphene; the semifinished product comprises at least one electrically insulating layer structure, in particular comprising at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; wherein the component fixation structure comprises or consists of the same material, in particular the same resin, as at least one of the base structure and the at least one electrically insulating layer structure; wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip; the semifinished product is shaped as a plate; wherein the component carrier to be manufactured from the semifinished product is configured as one of the group consisting of a printed circuit board; and a substrate.

A component carrier includes an interconnected stack comprising at least one electrically insulating layer structure and/or at least one electrically conductive layer structure; a component fixation structure in the stack; and a component embedded in the stack and extending partially into the component fixation structure so that a thickness of the component fixation structure under the component is smaller than a thickness of the component fixation structure laterally to the component.

The component carrier as described in the preceding paragraph wherein the component carrier is warpage-free.

The component carrier as described in paragraph [00140] wherein the component intrinsically comprises warpage.

The component carrier as described in paragraph [00140] including at least one of the following features: the component carrier comprises a shielding structure configured for shielding electromagnetic radiation from propagating between an exterior of the component carrier and the component; the component carrier includes a heat removal structure configured for removing heat from the component during operation of the component carrier; the component carrier includes at least one further component stacked and electrically connected with the component; wherein at least part of the interconnected stack forms a flex board section; wherein the thickness of the component fixation structure under the component is in a range between 1 µm and 50 µm, in particular in a range between 2 µm and 10 µm; the component carrier includes at least one electrically conductive contact structure electrically connecting the embedded component and being configured as at least one of the group consisting of a contact hole at least partially filled with electrically conductive material and extending at least partially through the interconnected stack up to the component, and a patterned electrically conductive layer structure on or above and electrically connected with the component.

The invention claimed is:

1. A method of fixing a component, the method comprising:
    providing a base structure having a main surface, the base structure defining a cavity that is at least partially covered by a component fixation structure;
    providing a component, the component intrinsically comprising warpage such that the component shows bending prior to mounting; thereafter,
    mounting the component on a surface of a carrier to thereby remove the warpage of the component at least partially as a result of the mounting; and
    fixing the component by interconnecting the base structure with the carrier so that the component extends into the component fixation structure in the cavity.

2. The method according to claim 1, wherein mounting the component on the surface of the carrier comprises adhering the component to the surface of the carrier.

3. The method according to claim 1, wherein the surface of the carrier comprises a planar sticky surface.

4. The method according to claim 1, further comprising:
removing the carrier after fixing the component to a component carrier.

5. The method according to claim 1, wherein the carrier is an integral part of a component carrier.

6. The method according to claim 1, wherein mounting the component on the surface of the carrier comprises applying a pressure on the component to force it against the surface of the carrier.

7. The method according to claim 1, wherein mounting the component on the surface of the carrier comprises applying heat to at least one of the component and the surface of the carrier.

8. The method according to claim 1, wherein subsequent to fixing, a portion of the component fixation structure is between the component and the base structure.

9. The method according to claim 1, wherein subsequent to fixing, a portion of the component fixation structure covers the majority of a peripheral surface of the component.

10. The method according to claim 5, wherein the component fixation structure fills a space between two electrically insulating layers where the component is placed.

11. The method according to claim 1, wherein the component fixation structure fixes a pressing layer provided on a side of the component that is opposite to a side of the component facing the base structure.

12. The method according to claim 8, wherein subsequent to fixing, a portion of a thickness of the component fixation structure between the component and the base structure is smaller than a thickness of the component fixation structure provided laterally to the component.

13. The method according to claim 1, wherein the component fixed to the carrier is pressed against the component fixation structure while the component fixation structure is in an uncured state, thereby embedding the component in the component fixation structure.

14. The method according to claim 1, wherein a main surface of the component is in direct contact with the carrier.

15. The method according to claim 1, wherein the cavity provided in the base structure of the component carrier is defined by an electrically conductive structure of the base structure.

16. The method according to claim 15, wherein the component fixation structure extends beyond the cavity into an electrically insulating structure of the base structure.

17. The method according to claim 1, wherein the component fixation structure is formed as a full layer.

18. The method according to claim 1, wherein the component fixation structure is provided in a predetermined region around the component.

19. The method according to claim 4, further comprising:
providing at least one electrically conductive contact structure extending from an external surface of the component carrier to the component.

20. The method according to claim 19, wherein the at least one electrically conductive contact structure comprises at least one of the following features:
the at least one electrically conductive contact structure is connected to opposed surfaces of the component;
the at least one electrically conductive contact structure comprises at least one contact portion passing through the component fixation structure;
the at least one electrically conductive contact structure comprises at least one contact portion passing through the base structure only and up to component;
the at least one electrically conductive contact structure comprises at least one contact portion in direct contact with the component.

* * * * *